(12) United States Patent
Levy et al.

(10) Patent No.: US 7,669,321 B1
(45) Date of Patent: Mar. 2, 2010

(54) METHODS FOR VERIFYING CORRECT COUNTER-BORE DEPTH AND PRECISION ON PRINTED CIRCUIT BOARDS

(75) Inventors: John Benjamin Levy, Los Altos, CA (US); John Martin, Los Gatos, CA (US); Farhad Pakravan, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 326 days.

(21) Appl. No.: 11/375,435

(22) Filed: Mar. 14, 2006

Related U.S. Application Data (60) Provisional application No. 60/699,067, filed on Jul. 13, 2005.

(51) Int. Cl.
*H01K 3/10* (2006.01)

(52) U.S. Cl. .................. 29/852; 29/402.01; 29/402.06; 29/407.01; 29/825; 174/260; 174/261; 408/1 R; 408/12; 408/13

(58) Field of Classification Search ............... 29/852, 29/402.01, 402.06, 407.01, 825; 174/260, 174/261; 361/784, 790; 408/1 R, 12, 13
See application file for complete search history.

(56) References Cited

U.S. PATENT DOCUMENTS 5,066,171 A * 11/1991 Arai et al. ................ 408/1 R
7,096,555 B2 * 8/2006 Tourne et al. ............ 29/402.06

* cited by examiner

*Primary Examiner*—Thiem Phan
(74) *Attorney, Agent, or Firm*—BainwoodHuang (57) ABSTRACT

A test site is incorporated on a circuit board having a set of test connections passing through a test via on respective test connection layer, the test connection layers including (1) a first layer adjacent to a target layer, and (2) a second layer spaced apart from the target layer with the first layer therebetween. The test via is back-drilled from the direction of the second layer to remove undesired via metallization, breaking the test connections of all the layers through which it passes, and the continuity of the test connections is measured to determine a pattern of broken and non-broken test connections resulting from the back-drilling. The pattern of broken and non-broken test connections is examined to ascertain the actual depth of the back-drilling in relation to the target layer.

12 Claims, 12 Drawing Sheets

METHODS FOR VERIFYING CORRECT COUNTER-BORE DEPTH AND PRECISION ON PRINTED CIRCUIT BOARDS

CROSS REFERENCE TO RELATED APPLICATIONS

This Patent Application claims the benefit under 35 U.S.C. § 119(e) of U.S. Provisional Patent Application No. 60/699,067 filed on Jul. 13, 2005 entitled, METHODS AND APPARATUS FOR VERIFYING CORRECT COUNTER-BORE DEPTH AND PRECISION ON PRINTED CIRCUIT BOARDS, the contents and teachings of which are hereby incorporated by reference in their entirety.

BACKGROUND

The present invention is related to the field of printed circuit board manufacturing.

In the manufacture of printed circuit boards, especially relatively thick circuit boards such as used for backplanes and mid-planes in electronic equipment, it is known to perform counter-boring or back-drilling of selected plated through holes (vias) that are used to make signal connections between different layers. If the connection formed by a via is near one surface of the circuit board, then the part of the via extending away from the connection to the other surface of the circuit board forms a "stub" that can cause undesirable effects on high-frequency signals. By back-drilling such vias to remove the stub, the quality of the signals carried by these via connections can be improved.

There are known methods of verifying that back-drilling is being performed to the correct depth. These methods include the use GO/NO-GO depth gauges to verify drill depth, either on a representative sample of back-drilled vias or on all back-drilled vias. This method only determines the depth of the drilled hole without any indication of the hole's relationship to the target signal layer, whose depth may vary considerably due to normal manufacturing tolerances. As an alternative, time-domain reflectometry (TDR) testing can be used to identify gross changes in the via stub length, but with only limited resolution.

In theory, back-drilling is a simple manufacturing process, but it has not been readily verifiable. The target layer's actual depth in the PCB stackup can vary substantially due to variations in raw material thickness and processing. Drilling too deep can ruin the board. Drilling too shallow may leave too much via stub, increasing the risk of latent signal-integrity issues which could cause the system to exhibit transient errors or to fail when upgraded to higher signaling rates, possibly after being in service for many years. Standard continuity checking only confirms that the counter-bore operation did not create any open circuits, and provides no information regarding the depth of the back-drilling with respect to the target signal layer.

SUMMARY

Because of the high degree of reliability and long lifetimes required of some products containing printed circuit boards, such as carrier-class telecommunications devices, it is important that the printed circuit board back-drilling process be controlled and verified to greater resolution than can be achieved using known techniques.

A method is disclosed that employs one or more test sites on a circuit board during manufacture to provide an indication that back-drilling has been accomplished to a specific tolerance, and to enable the tolerance to be modified as the back-drilling process improves. The test site employs a guard layer to prevent nicking of traces on a target signal layer, and one or more additional test connection layers that can be used to bracket the tolerance region and yield a clearer picture of the actual tolerance achieved. The method may be implemented using otherwise standard circuit board production techniques and test equipment, and it will confirm that back-drilling has been performed to specified manufacturing tolerances. Furthermore, the specified manufacturing tolerances may be altered after the circuit board is in production without requiring new testing circuitry that would require new circuit board layout artwork.

In particular, the disclosed method includes incorporating a test site on a circuit board, the test site having a set of test connections passing through a test via on respective test connection layers of the circuit board, the test connection layers including (1) a first layer adjacent to a target layer, and (2) a second layer spaced apart from the target layer with the first layer therebetween. The test via is back-drilled from the direction of the second layer to remove undesired via metallization, the back-drilling breaking the test connections of all the layers through which it passes, and the continuity of the test connections is measured to determine a pattern of broken and non-broken test connections resulting from the back-drilling. The pattern of broken and non-broken test connections is examined to ascertain the actual depth of the back-drilling in relation to the target layer.

In a more specific embodiment, the first layer is a "must-not-cut" layer serving to protect connections on the target layer from being partially broken by the back-drilling, and the examining of the pattern of broken and non-broken test connections includes determining whether a test connection on the must-not-cut layer is non-broken. The first layer may be immediately adjacent the target layer with no other conductive layers therebetween, or it may be spaced apart from the target layer with at least one other conductive layer therebetween.

The second layer may be a "must-cut" layer serving to establish a minimum back-drilling depth, and the examining of the pattern of broken and non-broken test connections includes determining whether a test connection on the must-cut layer is broken.

The test connections of the test site may include additional test connections passing through the test via on respective additional test connection layers disposed between the first and second layers. The pattern of broken and non-broken test connections of these additional layers may provide more precise information concerning the depth of back-drilling.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIGS. 7 (including 7A, 7B and 7C) are plan schematic views of respective inner layers of the test site of FIG. 6;

FIGS. 8 (including 8A, 8B and 8C), 9 (including 9A, 9B and 9C), 10 (including 10A, 10B and 10C), and 11 (including 11A, 11B and 11C) are plan schematic views of the inner layers of the test site of FIGS. 7A to 7C showing results of respective different back-drilling depths;

FIG. 13 (13A and 13B) is a side schematic depiction of a 52-layer printed circuit board employing test layers for back-drilling in accordance with the present invention.

DETAILED DESCRIPTION

Figure 1:
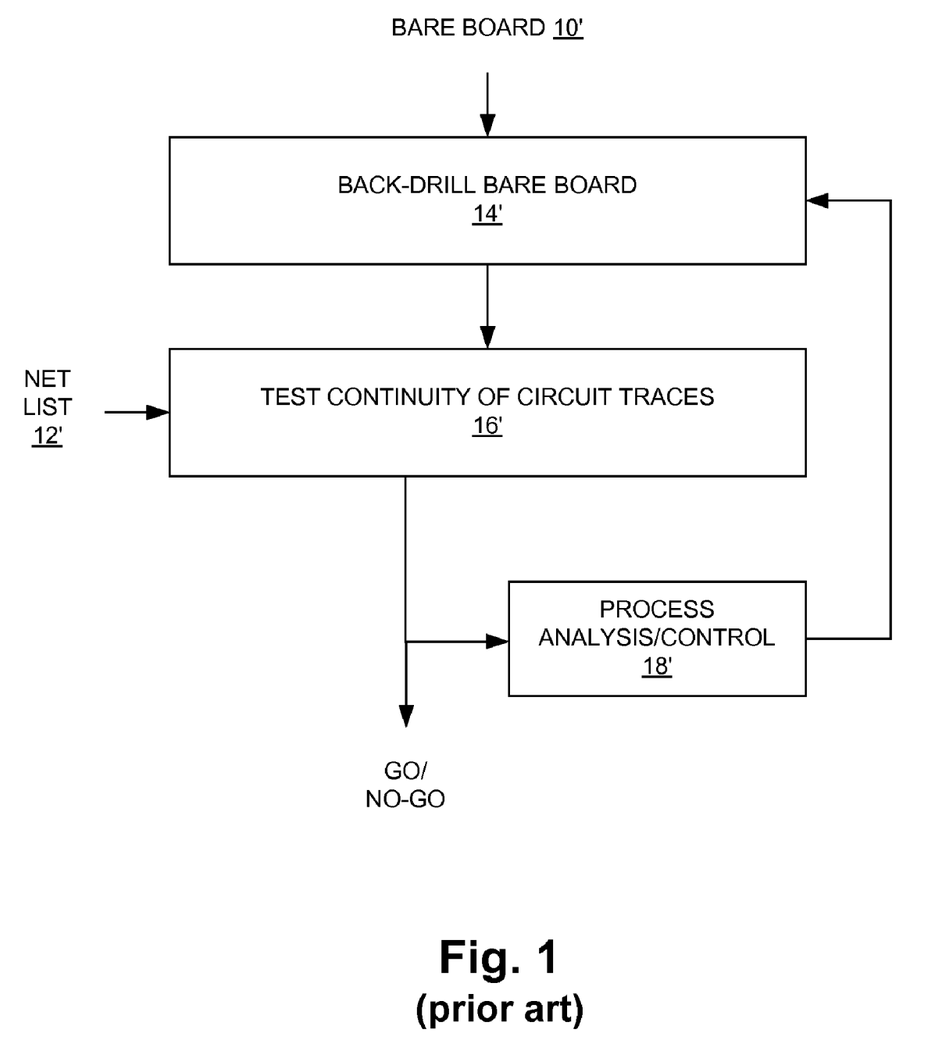
FIG. 1 is a flow diagram of a portion of a process of manufacturing printed circuit boards as known in the art.

FIG. 1 illustrates the pertinent portion of a prior-art process of manufacturing printed circuit boards. The inputs at this stage are (1) a "bare board" 10', i.e., a multi-layer circuit board with plated vias having no separate circuit components (integrated circuits, discrete components such as resistors, capacitors etc.) yet attached, and (2) a "net list" 12', which is an electronic data file representing the entire set of interconnections that should exist on the circuit board. In step 14', the bare board 10' is back-drilled to remove via stubs as described above. In step 16', the net list 12' is used in conjunction with conventional testing apparatus to perform a continuity test of the circuit traces on the back-drilled circuit board. The indication from the continuity testing of step 16' is generally a GO/NO-GO type of indication, i.e., it indicates only whether the back-drilled circuit board conforms to the net list 12'. The GO/NO-GO indication is used to determine whether the back-drilled circuit board can be used in subsequent steps for creating a fully populated and functioning circuit module. Additionally, the GO/NO-GO indication may be provided to a process analysis/control function 18' whose output is used in some fashion to control the back-drilling process of step 14'. As an example, the process analysis/control function 18' may detect an unduly high rate of NO-GO indications over some period, and respond by adjusting the back-drilling of step 14' accordingly, such as by altering the back-drilling depth etc.

Figure 2:
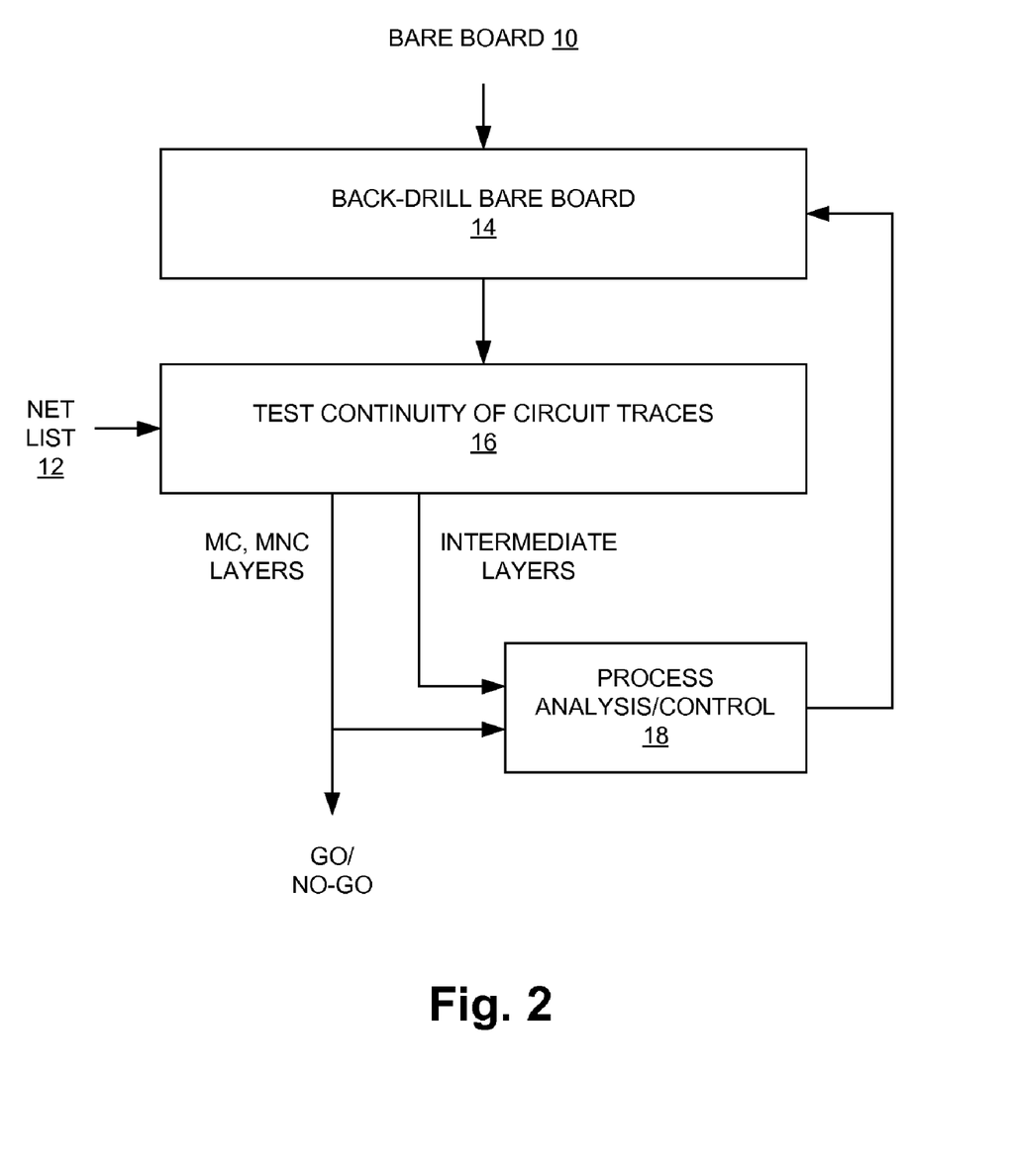
FIG. 2 is a flow diagram of a portion of a process of manufacturing printed circuit boards in accordance with the present invention.

FIG. 2 illustrates an improved process of back-drilling and continuity-testing bare circuit boards. Overall, the process of FIG. 2 has inputs and processing steps that have corresponding counterparts in FIG. 1 (e.g., a bare board 10 vs. the bare board 10' of FIG. 2, a back-drilling step 14 vs. the back-drilling step 14' of FIG. 2). Detailed aspects of these inputs and processing steps are described below. In brief, the process of FIG. 2 differs from that of FIG. 1 by including circuitry and processing steps that provide for better control and measurement of back-drilling depth, so as to improve circuit performance by reducing undesirable via stubs. In particular, the process of FIG. 2 incorporates circuit traces on at least two layers of the bare board 10 that provide outer limits for the depth of back-drilling, these being termed a "must cut" (MC) layer and a "must not cut" (MNC) layer. Optional additional circuit traces of intermediate layers may also be used to provide even finer indication and control of the back-drilling depth. In addition to the GO/NO-GO indications generated by the MC and MNC layers, continuity indications for the intermediate circuit traces may be provided to the process analysis/control step 18 for evaluating and controlling the back-drilling step 14.

In the process of FIG. 2, the back-drilling step 14 is generally of the type referred to as "controlled depth" back-drilling, which involves establishing a reference and then drilling a precise distance with respect to the reference. It is common, for example, to reference the tip of the drill bit to the top surface of the item being drilled, and then to drill a precise predetermined depth away from that reference. An alternative referencing method is to reference the tip of the drill bit to the bottom surface, which is typically pressed against a hard, flat support, and then drill from the top surface and stop at a point that is a precise distance away from that reference. The second technique may provide better precision for deeper holes.

The continuity testing step 16 of FIG. 2 may be carried out using conventional continuity testing apparatus, including so-called "flying probe" testers and "bed of nails" testers. Two-sided testers may be employed for two-sided boards 10 such as mid-planes.

Figure 3:
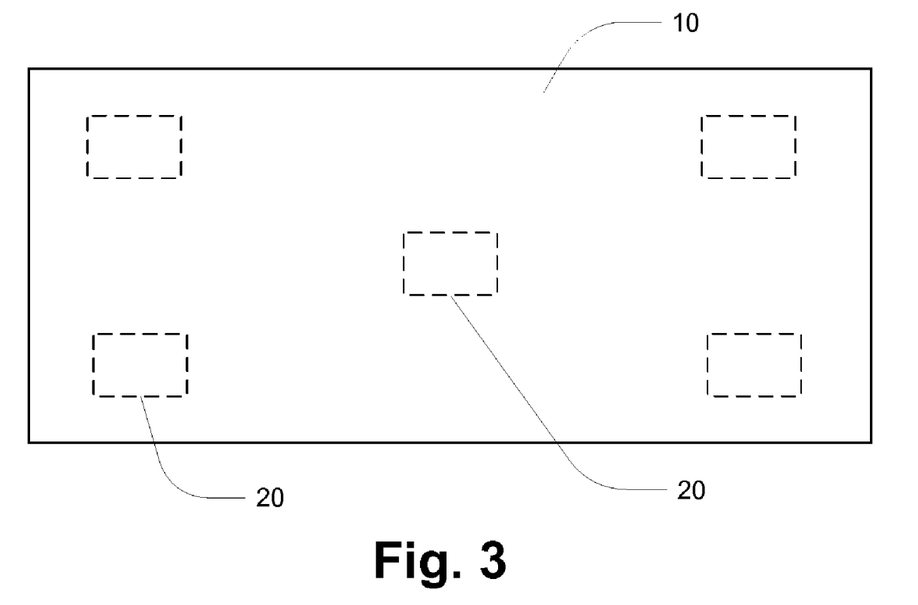
FIG. 3 is a plan schematic diagram of a printed circuit board incorporating multiple test sites that can be used in the process of FIG. 2.

FIG. 3 illustrates that several test sites 20 may be included on the bare board 10, especially in the case of a large circuit board such as a mid-plane or back-plane of a large electronic assembly (e.g., a rack-mounted communications switch). Test circuitry is incorporated into the electrical and physical make-up of the bare board 10 at the test sites 20. The test circuitry is independent of the normal functional circuitry of the board 10. It is assumed that monitoring back-drilling performance at the test sites 20 provides information about back-drilling performance with respect to the normal operating circuitry elsewhere on the board 10, and thus it is important that the test site locations be selected to justify this assumption. Variables that can affect the validity of this assumption include localized variation in board thickness as well as any bowing or bending of the board 10 that might occur during the back-drilling process. Thus it can be beneficial to use multiple test sites 20 to detect variation in back-drilling performance in different areas of larger circuit boards 10. It will be appreciated that on smaller circuit boards it may be sufficient to use fewer test sites, perhaps as few as one on a sufficiently small board.

In the illustrated embodiment, the test sites 20 are located such that they remain part of the fully tested circuit board after back-drilling and other circuit board assembly operations are complete, although not part of the normal operating circuitry. In alternative embodiments, it may be desirable to locate one or more test sites 20 on a physically separable part of a bare circuit board, such structures often referred to as "coupons". After the processing steps that involve the use of the test site(s) 20 are complete, the coupon is physically separated from the remaining part of the circuit board, on which the normal operating circuitry is formed. The coupon may be subject to destructive testing or retained for some period of time to assist in resolving any issues which may arise in the finished circuit boards 10.

Figure 4:
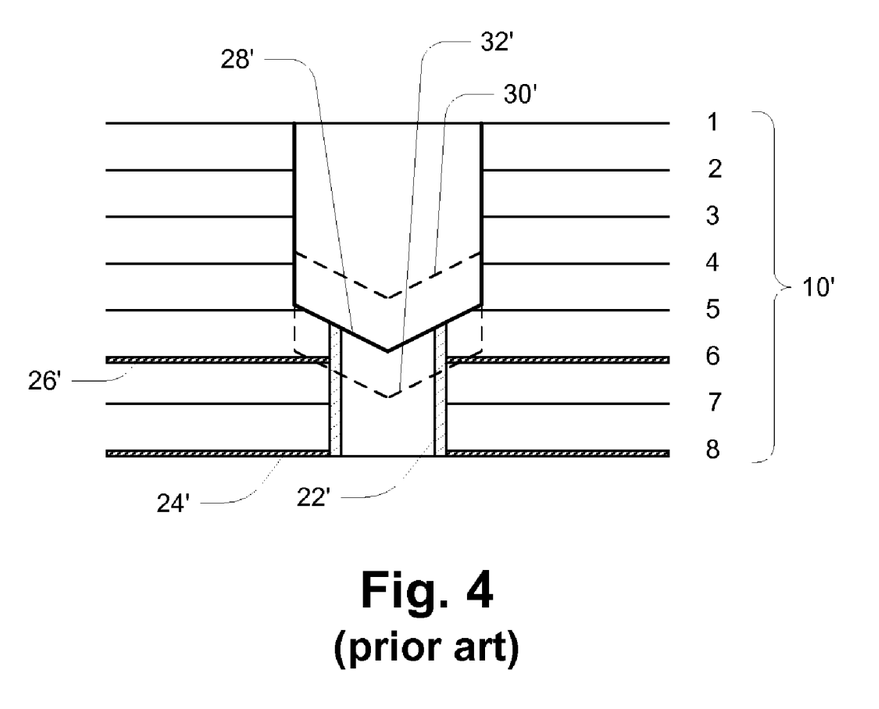
FIG. 4 is a schematic depiction of the back-drilling of a via in accordance with the prior-art process of FIG. 1.

FIG. 4 depicts conventional back-drilling in a schematic manner. The view is taken to be an edge view of a circuit board such as the bare board 10' of FIG. 1. The multiple-layer structure is shown. For convenience, the layers are numbered 1-8 as shown. It is assumed that a via 22' is used to establish a connection between a trace 24' on the layer 8 and a trace 26' on layer 6, and it is desired to back-drill this via to remove its upper portion extending from layers 1 to layer 5. Three possible results of the back-drilling operation are shown. The desired result is a back-drilled hole extending from layer 1 to just past layer 5, such that as much of the via 22' is removed without disturbing the connection at layer 6. This result is shown by the solid line 28'. Two other results, indicated by dotted lines 30' and 32', are possible due to normal tolerances of the back-drilling process. In the case of back-drilling to the location of line 30', an insufficient amount of the via 22' has been removed, so that a stub portion extending from about layer 4 to layer 6 would remain. In the case of back-drilling to the location of line 32', the desired connection at layer 6 has been severed, so the circuit board will not function correctly. It should be noted that circuit board manufacturers usually avoid the situation depicted by line 32' by setting the nominal back-drilling depth (line 28') higher, say at layer 4 or 3. Although this reduces the risk of severing the connection at layer 6, it also ensures that on average a significant amount of via stub remains, which is undesirable from the perspective of maximizing the performance of the circuit.

Figure 5:
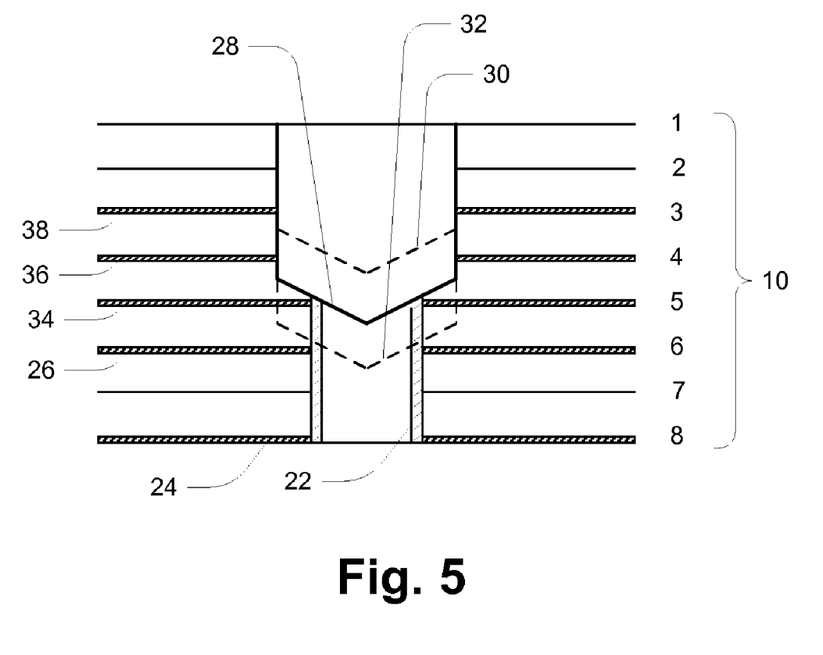
FIG. 5 is a schematic depiction of the back-drilling of a test via in accordance with the presently disclosed process of FIG. 2.

FIG. 5 depicts back-drilling in accordance with the process of FIG. 2. A test via 22 is assumed to be representative of other vias of the board 10 that are to provide connections no higher than layer 6, and thus are to be back-drilled accordingly. That is, the back-drilling of the test via 22 is monitored by the presently disclosed technique to obtain information about the proper back-drilling of normal signal vias of similar construction.

In FIG. 5, different back-drilling hole depths are indicated by lines 28 (nominal), 30 (shallow), and 32 (deep) are shown. Three additional circuit layers 34, 36 and 38 are also shown. The circuit layer 34 functions as a guard layer which can provide an indication whether back-drilling may have nicked or partially severed the connection at layer 6. If the back-drilling were to end near the location of line 32, there might be enough layer-6 connection remaining that the board 10 passes a continuity check, but the connections provided by similar vias on the board 10 may be inadequate for the high-frequency signals they carry during normal operation. This situation of a marginal layer-6 connection can be prevented by use of the guard layer 34. The guard layer 34 can be connected in a fashion that the continuity checking 16 (FIG. 2) can determine whether the connection at layer 5 has been severed. If not, then there can be greater confidence that the above situation of marginal layer-6 connections has not occurred. If the layer-5 connection of the test via 22 has been severed, then it is possible that marginal layer-6 connections have been created. Because of this use of the guard layer 34, it may also be referred to as a "must not cut" or MNC layer which provides the MNC indication of FIG. 2.

The top-most layer 38 serves a similar function but in the reverse direction—it can be used to determine if back-drilling has achieved at least some minimum specified depth. If so, the connection at layer 2 of the test via is severed, and this is detected during the continuity checking 16 of FIG. 2. The layer 38 may be termed a "must cut" or MC layer which provides the MC indication of FIG. 2. Along with the MNC layer 34, the MC layer 38 serves to determine whether the back-drilling depth is within a desired maximum range.

In addition to the layers 34 and 38, an intermediate layer 36 is disposed at layer 4 of the circuit board 10. This layer can be used to provide a finer indication of the exact depth of back-drilling. This indication can be used for a variety of purposes in the process analysis/control step 18. It can be used to determine if the back-drilling depth is drifting one way or another over time, or if some change to the back-drilling process 14 has caused a sudden shift of the average back-drilling depth in one direction or another. Other uses of the information provided by the intermediate layer 36 are also possible. Also, it may be desirable to use multiple intermediate layers and corresponding indications. It should also be noted that the function and definition of the various layers such as layers 34-38 may be varied as desired in a manufacturing process. While at one time the layer 38 may function as the MC layer, as the process is refined it may become desirable to utilize the layer 36 as the MC layer, in which case the layer 38 may be either unused or used in a different fashion by the process analysis/control step 18.

Figure 6:
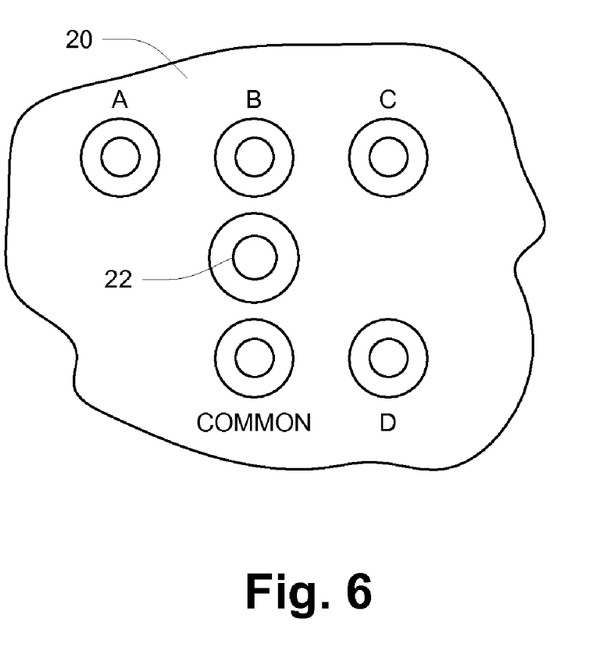
FIG. 6 is a plan schematic view of an outer surface layer of a test site on the printed circuit board of FIG. 3.

FIG. 6 illustrates an outer layer of a test site 20 in plan view. Test connection points labeled A, B, C, D and Common are shown. These connection points surround the test via 22.

Figure 7A:
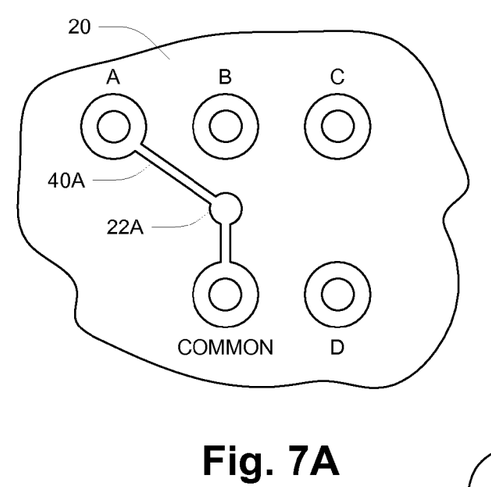
Figure 7B:
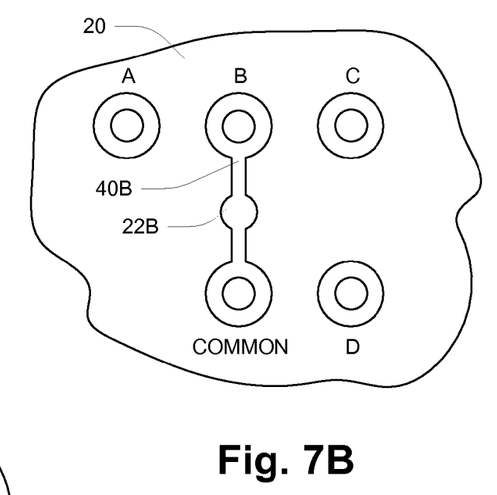
Figure 7C:
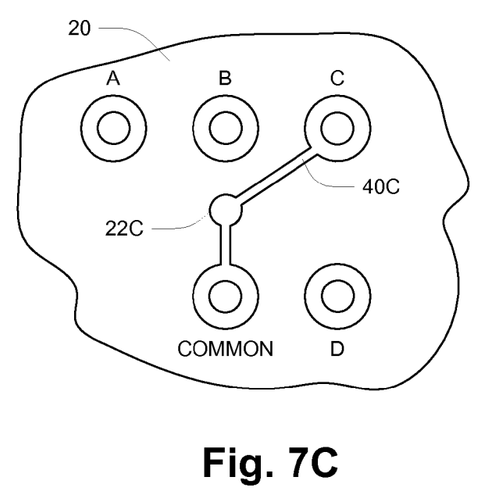

FIGS. 7A to 7C show the respective configurations of circuit traces forming test connections on three different layers of the board 10 at the test site 20. The layers of FIGS. 7A, 7B and 7C may respectively correspond to a MC layer (such as layer 38), an intermediate layer (such as layer 36) and a MNC layer (such as layer 34). Each layer includes a trace 40 (40A, 40B or 40C) forming a test connection between the Common test connection point and the respective one of the A, B and C test connection points. As shown, each trace 40 runs through a corresponding layer 22A, 22B, 22C of the test via 22. FIG. 7 illustrates the circuit traces 40 as they exist on the bare board 10 prior to back-drilling. Thus it will be appreciated that prior to back-drilling the Common test connection point is short-circuited to each of the A, B and C test connection points.

Figure 8A:
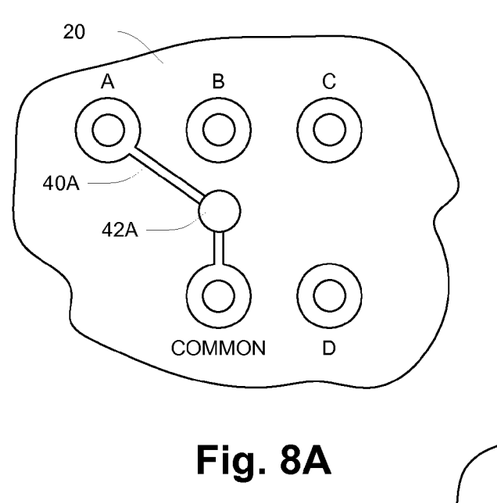
Figure 8B:
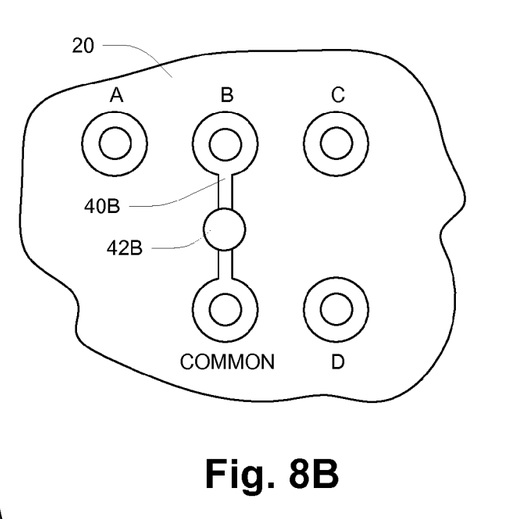
Figure 8C:
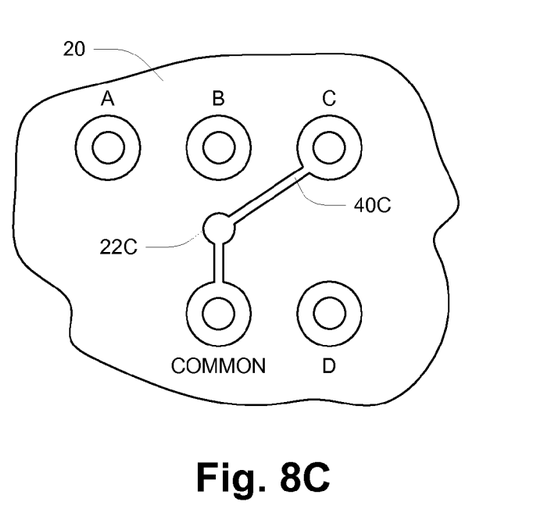

FIGS. 8A to 8C depict a first result of the back-drilling operation 14 of FIG. 2 in which the back-drilling depth is correct. The opening made by the back-drilling is shown as circular areas 42 (42A, 42B) on each layer. The layers 22A and 22B (FIG. 7) of the test via 22 have been removed, such that the traces 40A and 40B are severed and no longer provide continuity between the respective test connection points A, B and the Common test connection point. FIG. 8C shows that the via layer 22C is intact, with the possible exception of some nicking from the very tip of the drill bit, and thus the trace 40C continues to provide continuity between the test connection point C and the Common test connection point. Thus, correct back-drilling depth is indicated when the following pattern of broken and unbroken test connections is discovered in the continuity checking step 16:

Common to A: No continuity
Common to B: No continuity
Common to C: Continuity

Figure 9A:
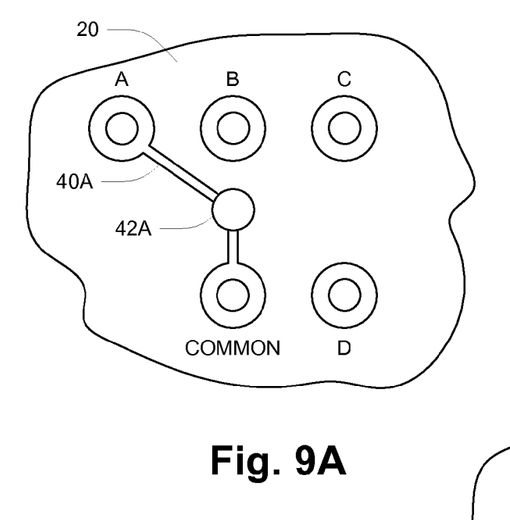
Figure 9B:
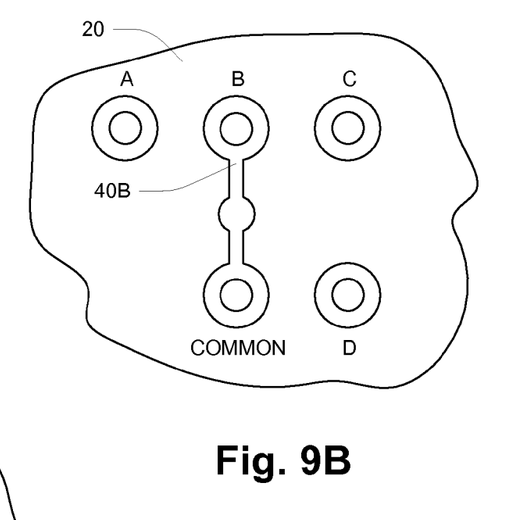
Figure 9C:
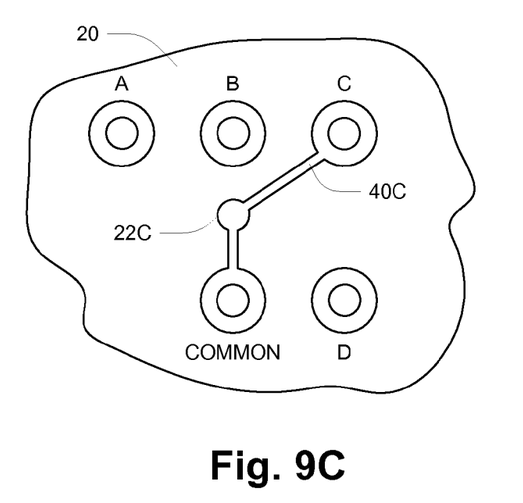

FIGS. 9A-9C, 10A-10C, and 11A-11C depict other potential results of the back-drilling operation 16. FIGS. 9A-9C depict a first case in which back-drilling is too shallow, as indicated by the following pattern of broken and unbroken test connections discovered in the continuity checking step 16:

Common to A: No continuity
Common to B: Continuity
Common to C: Continuity

Figure 10A:
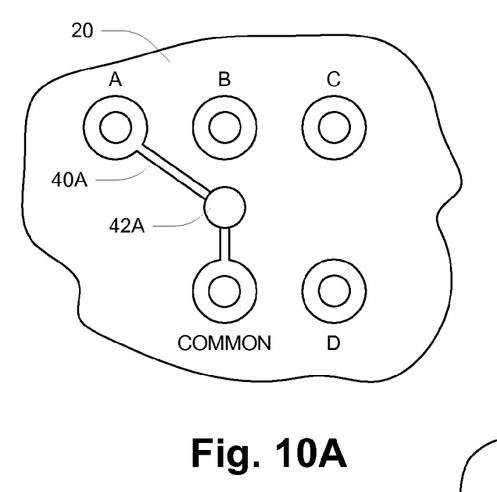
Figure 10B:
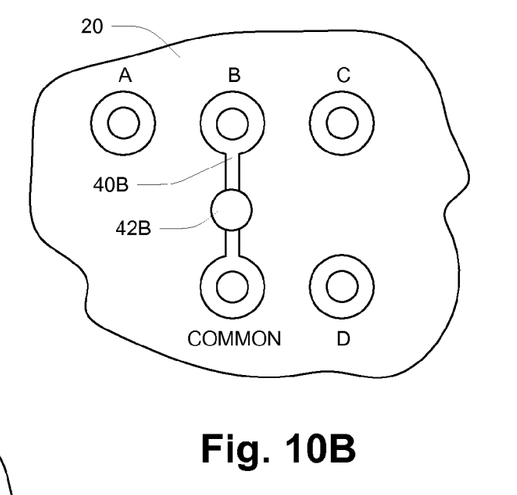
Figure 10C:
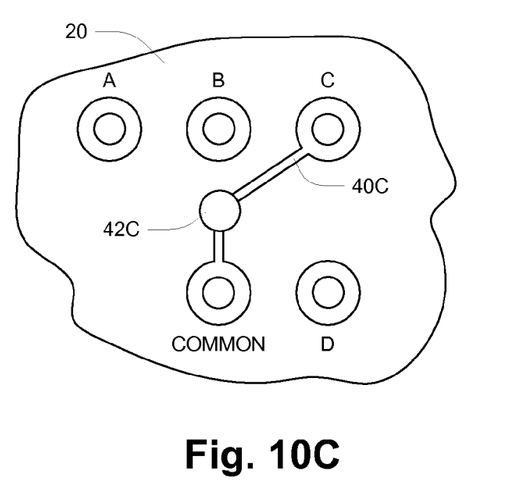
Figure 11A:
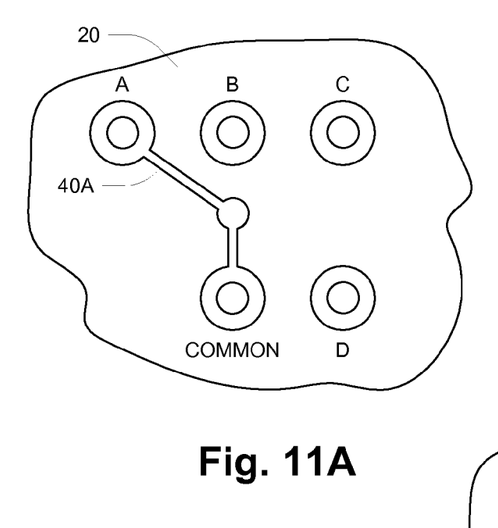
Figure 11B:
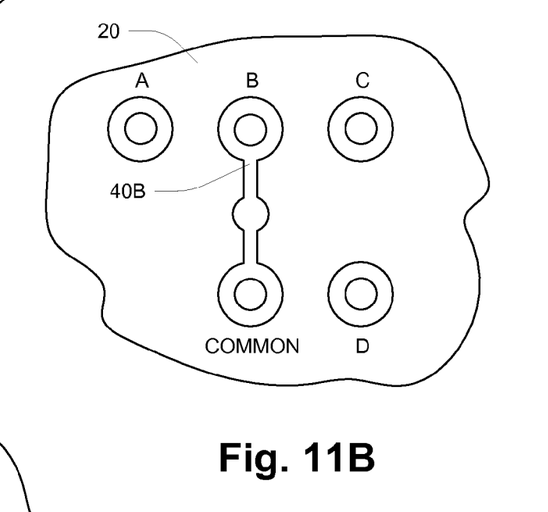
Figure 11C:
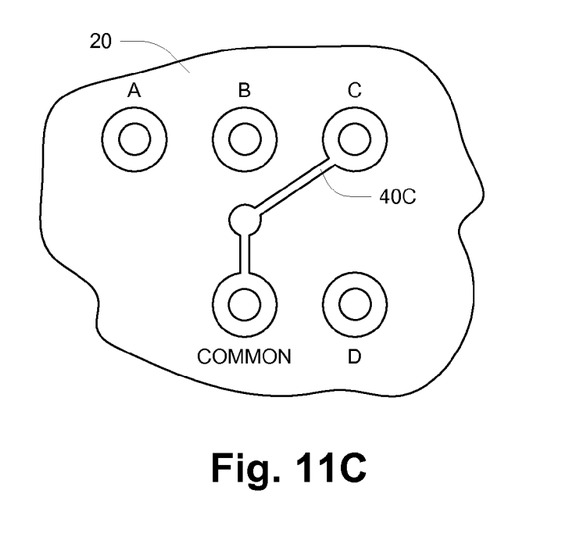

FIGS. 10A-10C depict a case in which back-drilling is too deep, as indicated by the following pattern of broken and unbroken test connections discovered in the continuity checking step 16:

Common to A: No continuity
Common to B: No continuity
Common to C: No continuity And FIGS. 11A-11C depict a second case in which back-drilling is too shallow, as indicated by the following patterns of broken and unbroken test connections discovered in the continuity checking step 16:

Common to A: Continuity
Common to B: Continuity
Common to C: Continuity

Figure 12:
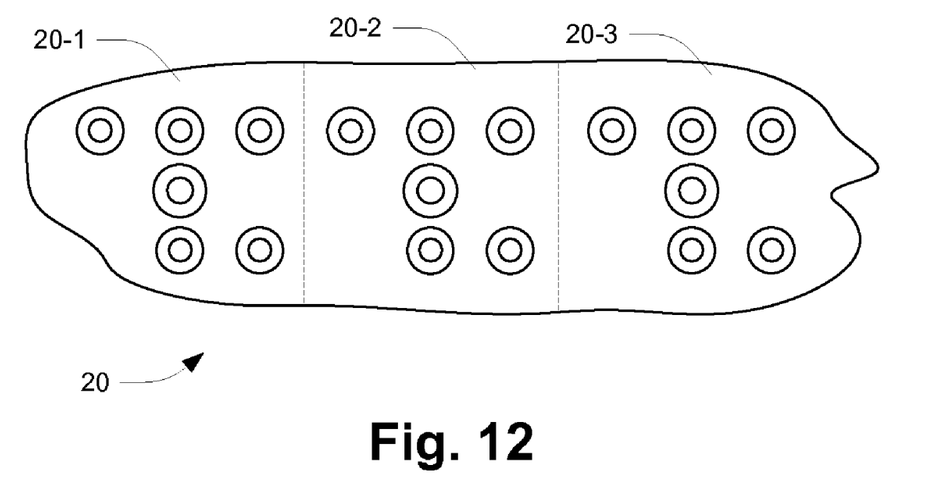
FIG. 12 is a plan schematic view of a test site having multiple sub-sites for testing different back-drilling depths.

FIG. 12 shows the use of multiple sub-sites 20-1, 20-2 and 20-3 adjacent to each other at a test site 20 to test for correct back-drilling at multiple depths. In general, it is possible to employ a different back-drilling depth for each internal layer of a multi-layer board, but in many applications it is sufficient to select a smaller number of possible back-drilling depths. For example, if back-drilling depths of ¼, ½ and ¾ of the board thickness are employed, then only three test sub-sites such as those shown in FIG. 12 are required. It will be appreciated that the traces 40 for each sub-site 20-1, 20-2 and 20-3 will generally lie on different sets of layers corresponding to the different back-drilling depths. It is necessary to have test sites for back-drilling done to either side of the board 10. It may be convenient to locate all the test connection points of the test sites 20 on one surface of a two-sided board, or alternatively to locate some on one side and some on the other.

Figure 13A:
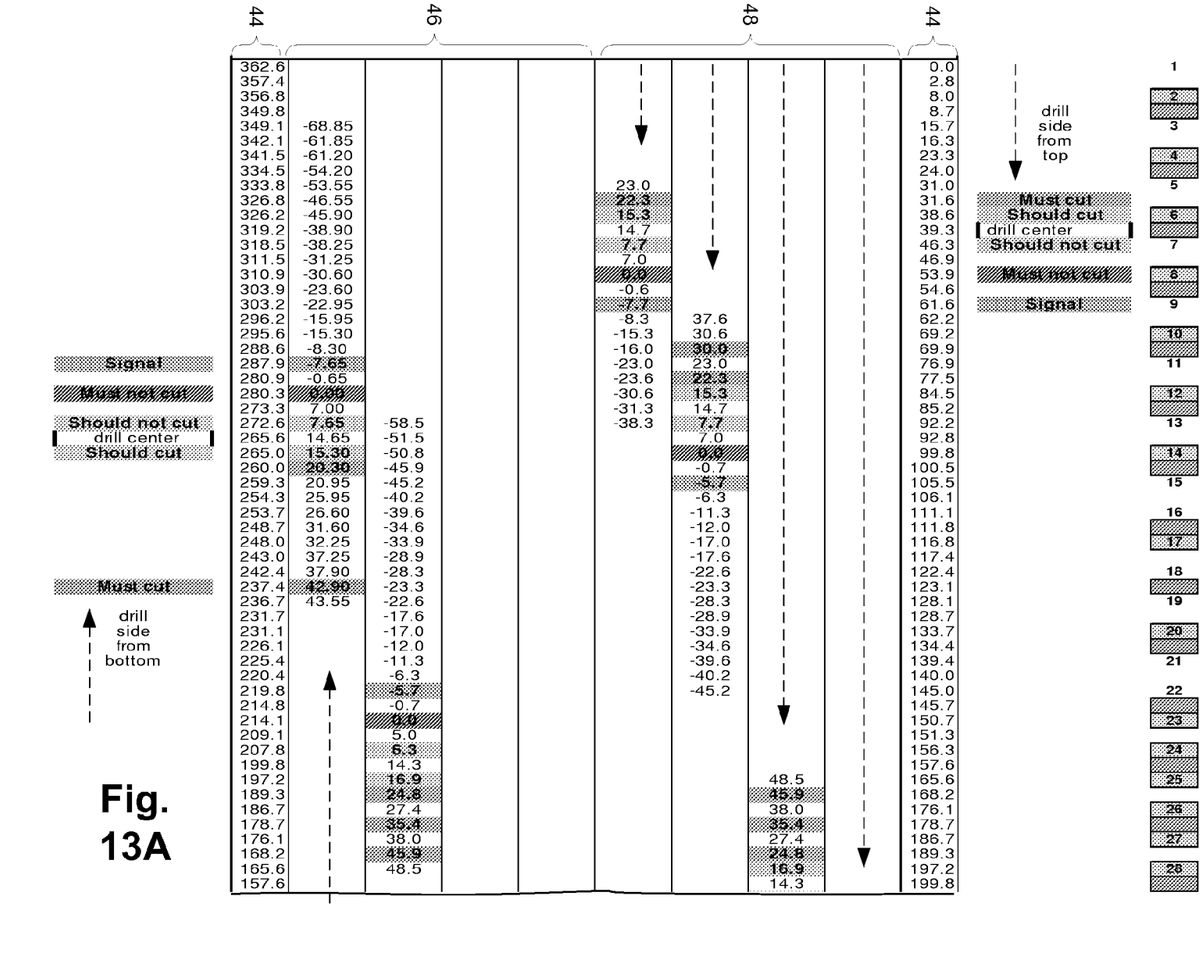
Figure 13B:
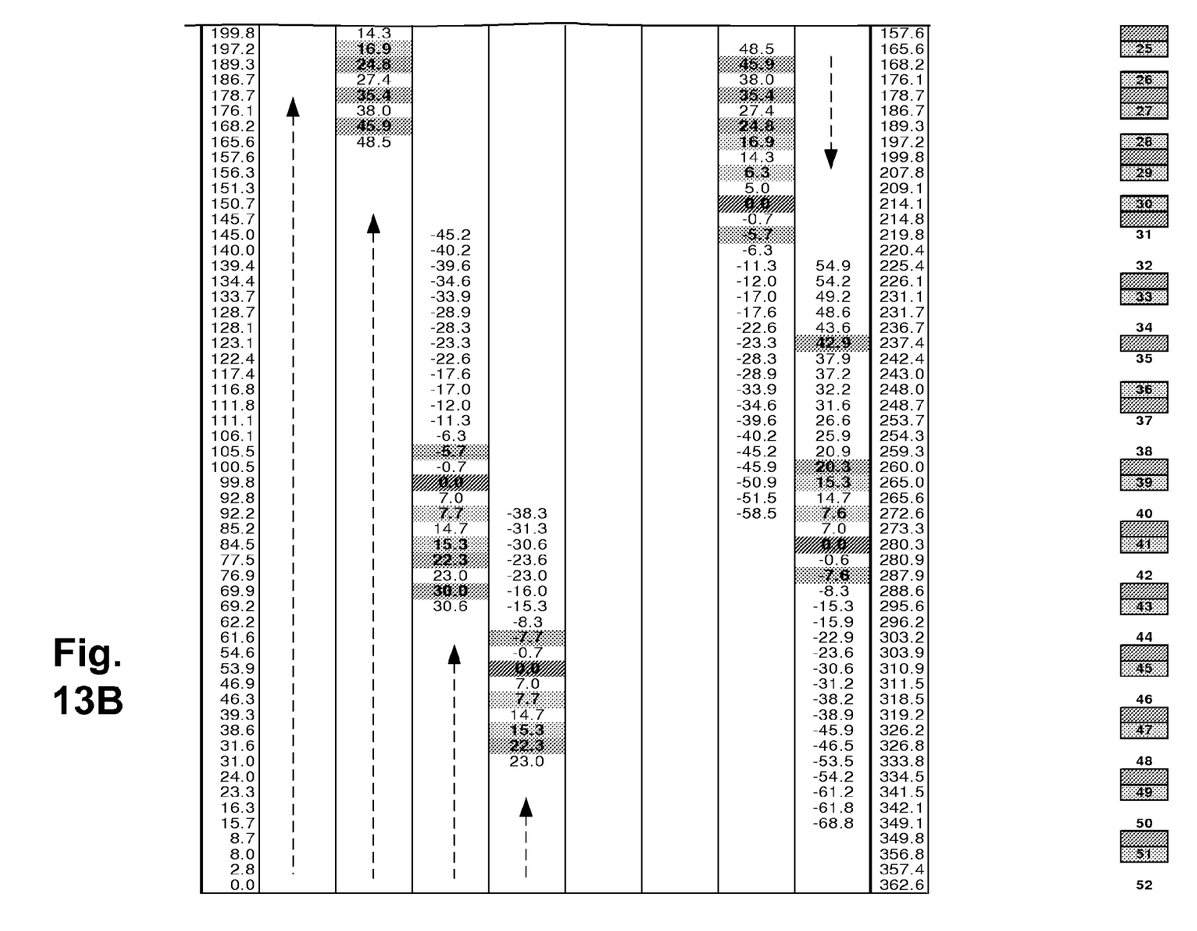

FIG. 13 (13A and 13B) schematically illustrates an exemplary 2-sided 52-layer board that employs multiple back-drilling depths from both sides of the board. The columns 44 indicate depth relative to the lower and upper sides of the board respectively in mils. The layers are numbered from 1 to 52 in the downward direction in FIG. 13. For back-drilling from the bottom as shown in the four left-of-center columns 46, the MNC layers are layers 45, 39, 23 and 12, with other layers being disposed relative thereto. For back-drilling from the top as shown in the four right-of-center columns 48, the MNC layers are layers 8, 14, 30 and 41, with other layers being disposed relative thereto. In FIG. 13, the numbers in each column indicate depth relative to the corresponding MNC layer. FIG. 13 illustrates that the definition of the various test connection layers (MC, MNC etc.) is with respect to a particular target (signal) layer, and not global across the board 10. Layer 14 of the circuit board, for example, serves as the MNC layer for those vias making connections at target layer 15 and being back-drilled from the top, but layer 14 also serves as an intermediate layer for those vias making connections at target layer 11 and being back-drilled from the bottom.

FIG. 13 also illustrates a potential optimization, which is to vary the spacing of the test layers as a function of back-drilling depth. The variability or tolerance of the final hole depth varies in rough proportion to the depth of the hole. Thus, it may make sense to space the test layers relatively closely for shallow holes, and relatively far apart for deeper holes. It will be observed in FIG. 13 that in the rightmost column there are seven layers between the MC layer 34 and the MNC layer 41, whereas in the just-right-of-middle column there are three layers between the MC layer 5 and the MNC layer 8. Using this configuration, the depth limits established by the MC and MNC layers reflect the limited precision of the drilling process.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of manufacturing a set of identical multiple-layer circuit boards, comprising:
    incorporating a test site on each of the set of circuit boards, the test site having a set of test connections passing through a test via on respective test connection layers of each of the set of circuit boards, the set of test connections including a first test connection, a second test connection, and a third test connection, the test connection layers including (1) a first layer adjacent to a target layer, (2) a second layer spaced apart from the target layer with the first layer therebetween, and (3) a third layer spaced apart from the target layer with the first layer and second layer therebetween;
        wherein the first layer includes a first test connection point, the second layer includes a second test connection point, the third layer includes a third test connection point, and the first test connection layer, the second test connection layer, the third test connection layer are short circuited to a common test connection point,
        wherein the first test connection point, the second test connection point, the third test connection point, and a common test connection point surround the test via,
        wherein the first test connection is a first conductive pathway from the first test connection point, through the test via, to the common test connection point,
        wherein the second test connection is a second conductive pathway from the second test connection point, through the test via, to the common test connection point, and
        wherein the third test connection is a third conductive pathway from the third test connection point, through the test via, to the common test connection point;
    back-drilling, on a first circuit board of the set of circuit boards, with a back-drill the test via from the direction of the third layer to remove undesired via metallization, the back-drilling breaking the test connections of all the layers through which it passes;
    measuring, on the first circuit board, the continuity of the test connections to determine a pattern of broken and non-broken test connections resulting from the back-drilling; and
    examining, on the first circuit board, the pattern of broken and non-broken test connections to ascertain the actual depth of the back-drilling of the test via in relation to the target layer;
    wherein the method further comprising:
        in response to examining, on the first circuit board, the pattern of broken and non-broken test connections, adjusting the back-drill based on the ascertained actual depth of the back drilling of the test via in relation to the target layer, and
        back-drilling with the adjusted back-drill the test via of a second circuit board of the set of circuit boards;
    wherein back-drilling, on the first circuit board, with a back-drill the test via from the direction of the third layer to remove undesired via metallization breaks the third test connection of all the third layer, the second test connection of the second layer, and the first test connection of the first layer;
    wherein measuring, on the first circuit board, the continuity of the test connections to determine a pattern of broken and non-broken test connections resulting from the back-drilling determines that the third test connection, the second test connection, and the first test connection are broken;
    wherein examining, on the first circuit board, the pattern of broken and non-broken test connections to ascertain the actual depth of the back-drilling of the test via in relation to the target layer determines that undesired via metallization has been removed and that the target layer may have been nicked; and
    wherein adjusting the back-drill based on the ascertained actual depth of the back drilling of the test via in relation to the target layer includes adjusting the back-drill to drill shallower.

2. A method according to claim 1, wherein the first layer is a must-not-cut layer serving to protect connections on the target layer from being partially broken by the back-drilling, and wherein examining the pattern of broken and non-broken test connections comprises determining whether a test connection on the must-not-cut layer is non-broken.

3. A method according to claim 2, wherein the first layer is immediately adjacent the target layer with no other conductive layers therebetween.

4. A method according to claim 2, wherein the first layer is spaced apart from the target layer with at least one other conductive layer therebetween.

5. A method according to claim 1, wherein the second layer is a must-cut layer serving to establish a minimum back-drilling depth, and wherein examining the pattern of broken and non-broken test connections comprises determining whether a test connection on the must-cut layer is broken.

6. A method according to claim 1, wherein the test connections of the test site include test connections passing through the test via on respective additional test connection layers disposed between the first and second layers.

7. A method according to claim 1, wherein the test site is one of plurality of similar test sites incorporated at respective different locations on each of the set of circuit boards.

8. A method according to claim 1, wherein the target layer is a first target layer at a first depth of the circuit board and the test connections, test via, test connection layers, and pattern of broken and non-broken connections are first site test connections, a first test via, first test connection layers, and a first pattern of broken and non-broken connections pertaining to the first target layer, and wherein the incorporating, back-drilling, measuring and examining are all repeated for respective second site test connections, second test via, second test connection layers and second pattern of broken and non-broken connections pertaining to a second target layer at a second depth of each of the set of circuit boards.

9. A method according to claim 8, wherein the first and second site test connections are immediately adjacent to each other so as to form part of the test site.

10. A method according to claim 8, wherein the first target layer is relatively shallow and the second target layer is relatively deep, and wherein the spacing between the first and second layers of the first site test connection layers is greater than the spacing between the first and second layers of the second site test connection layers.

11. The method according to claim 1, wherein the target layer includes the normal functional circuitry of the board, and the test connection layers include test circuitry that is independent of the normal functional circuitry of the board.

12. A method of manufacturing a set of identical multiple-layer circuit boards, comprising:
   incorporating a test site on each of the set of circuit boards, the test site having a set of test connections passing through a test via on respective test connection layers of each of the set of circuit boards, the set of test connections including a first test connection, a second test connection, and a third test connection, the test connection layers including (1) a first layer adjacent to a target layer, (2) a second layer spaced apart from the target layer with the first layer therebetween, and (3) a third layer spaced apart from the target layer with the first layer and second layer therebetween;
   wherein the first layer includes a first test connection point the second layer includes a second test connection point, the third layer includes a third test connection point, and the first test connection layer, the second test connection layer, the third test connection layer are short circuited to a common test connection point,
   wherein the first test connection point, the second test connection point, the third test connection point, and a common test connection point surround the test via,
   wherein the first test connection is a first conductive pathway from the first test connection point, through the test via, to the common test connection point,
   wherein the second test connection is a second conductive pathway from the second test connection point, through the test via, to the common test connection point, and
   wherein the third test connection is a third conductive pathway from the third test connection point, through the test via, to the common test connection point;
   back-drilling, on a first circuit board of the set of circuit boards, with a back-drill the test via from the direction of the third layer to remove undesired via metallization, the back-drilling breaking the test connections of all the layers through which it passes;
   measuring, on the first circuit board, the continuity of the test connections to determine a pattern of broken and non-broken test connections resulting from the back-drilling; and
   examining, on the first circuit board, the pattern of broken and non-broken test connections to ascertain the actual depth of the back-drilling of the test via in relation to the target layer;
   wherein the method further comprising:
      in response to examining, on the first circuit board, the pattern of broken and non-broken test connections, adjusting the back-drill based on the ascertained actual depth of the back drilling of the test via in relation to the target layer, and
      back-drilling with the adjusted back-drill the test via of a second circuit board of the set of circuit boards;
   wherein back-drilling, on the first circuit board, with a back-drill the test via from the direction of the third layer to remove undesired via metallization breaks the third test connection of the third layer and the second test connection of the second layer;
   wherein measuring, on the first circuit board, the continuity of the test connections to determine a pattern of broken and non-broken test connections resulting from the back-drilling determines that the third test connection and the second test connection are broken and that the first test connection is not broken;
   wherein examining, on the first circuit board, the pattern of broken and non-broken test connections to ascertain the actual depth of the back-drilling of the test via in relation to the target layer determines that undesired via metallization has been removed and that the target layer has not been nicked; and
   wherein adjusting the back-drill based on the ascertained actual depth of the back drilling of the test via in relation to the target layer includes adjusting the back-drill to maintain current drill depth.

* * * * *